United States Patent
Chen et al.

(10) Patent No.: US 11,869,769 B2
(45) Date of Patent: *Jan. 9, 2024

(54) METHOD AND SYSTEM OF CONTROL OF EPITAXIAL GROWTH

(71) Applicant: Taiwan Semiconductor Manufacturing Company, Ltd., Hsinchu (TW)

(72) Inventors: Winnie Victoria Wei-Ning Chen, Hsinchu County (TW); Andrew Joseph Kelly, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/651,878

(22) Filed: Feb. 21, 2022

(65) Prior Publication Data

US 2022/0199399 A1 Jun. 23, 2022

Related U.S. Application Data

(63) Continuation of application No. 16/384,572, filed on Apr. 15, 2019, now Pat. No. 11,257,671.

(60) Provisional application No. 62/738,727, filed on Sep. 28, 2018.

(51) Int. Cl.
*H01L 21/02* (2006.01)
*H01L 21/67* (2006.01)
*H01L 21/268* (2006.01)

(52) U.S. Cl.
CPC ........ *H01L 21/0262* (2013.01); *H01L 21/268* (2013.01); *H01L 21/67115* (2013.01)

(58) Field of Classification Search
CPC .............. H01L 21/0262; H01L 21/268; H01L 21/67115
See application file for complete search history.

(56) References Cited

U.S. PATENT DOCUMENTS

| | | | |
|---|---|---|---|
| 83,860,148 | | 1/1975 | Sherin et al. |
| 3,865,633 A | * | 2/1975 | Shannon .............. H01L 21/263 438/798 |
| 6,562,128 B1 | | 5/2003 | Dietze et al. |
| 7,334,202 B1 | * | 2/2008 | Singh .................... G06F 30/23 716/132 |
| 8,772,109 B2 | | 7/2014 | Colinge |
| 8,785,285 B2 | | 7/2014 | Tsai et al. |

(Continued)

OTHER PUBLICATIONS

Ishitani, A., "Prebaking and silicon epitaxial growth enhanced by UV radiation", Journal of Applied Physics, Mar. 15, 1987, pp. 2224-2229, vol. 61, No. 6, American Institute of Physics.

*Primary Examiner* — Mohammad M Choudhry
(74) *Attorney, Agent, or Firm* — Haynes and Boone, LLP

(57) ABSTRACT

A method of semiconductor fabrication includes positioning a substrate on a susceptor in a chamber and growing an epitaxial feature on the substrate. The growing includes providing UV radiation to a first region of a surface of the substrate and while providing the UV radiation, growing a first portion of the epitaxial feature on the first region of the surface while concurrently growing a second portion of the epitaxial feature on a second region of the surface of the substrate. The first portion of the epitaxial feature can be greater in thickness than the second portion of the epitaxial feature.

20 Claims, 11 Drawing Sheets

(56) References Cited

U.S. PATENT DOCUMENTS

| | | | |
|---|---|---|---|
| 8,796,048 B1 | 8/2014 | Thompson | |
| 8,816,444 B2 | 8/2014 | Wann et al. | |
| 8,823,065 B2 | 9/2014 | Wang et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,433,973 B1 | 9/2016 | Ni et al. | |
| 9,520,482 B1 | 12/2016 | Chang et al. | |
| 9,548,216 B1 | 1/2017 | Chen et al. | |
| 9,576,814 B2 | 2/2017 | Wu et al. | |
| 2005/0029123 A1 | 2/2005 | Uzoh et al. | |
| 2007/0170148 A1* | 7/2007 | Kuppurao | H01L 21/02529 216/37 |
| 2009/0227119 A1* | 9/2009 | Liu | H01L 21/02203 257/E21.349 |
| 2013/0320235 A1* | 12/2013 | Lien | H01L 21/3105 250/454.11 |
| 2016/0027671 A1* | 1/2016 | Ranish | H01L 21/67115 392/416 |
| 2016/0211259 A1 | 7/2016 | Guo et al. | |
| 2017/0032974 A1* | 2/2017 | Armour | H01L 29/66431 |
| 2017/0290933 A1 | 10/2017 | Collins et al. | |

\* cited by examiner

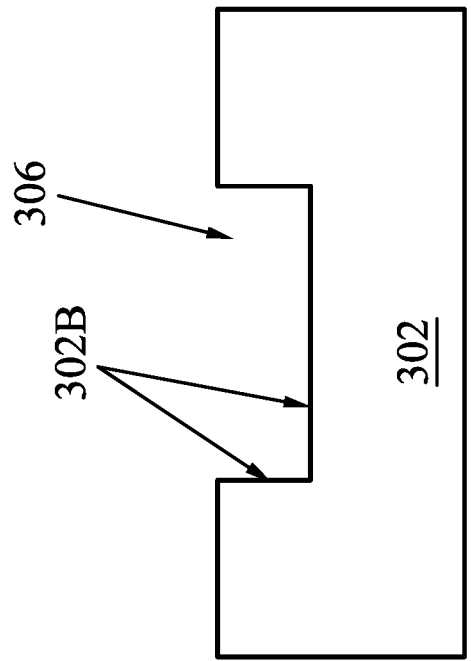
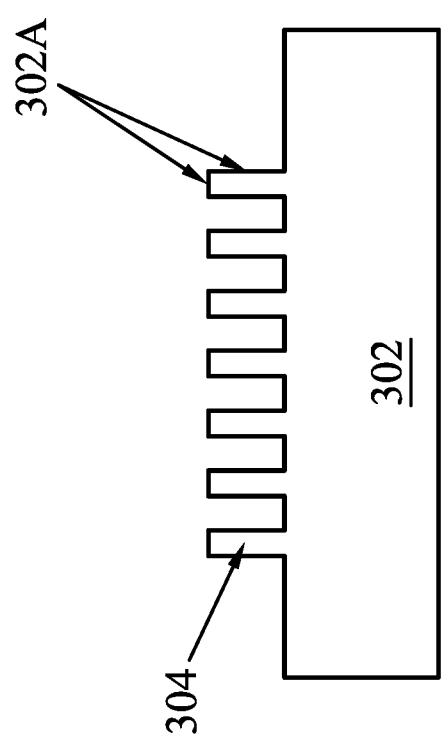
FIG. 3B
FIG. 3A

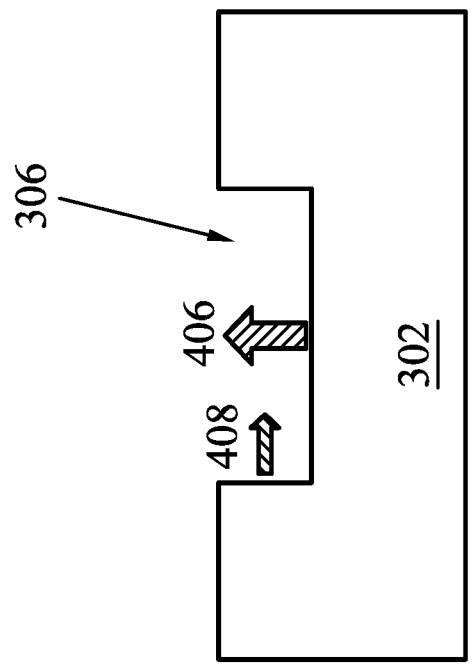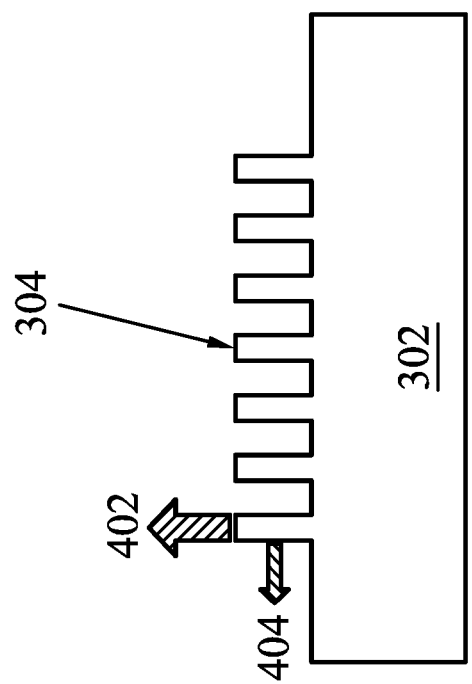
FIG. 4A
FIG. 4B

METHOD AND SYSTEM OF CONTROL OF EPITAXIAL GROWTH

CROSS-REFERENCE TO RELATED APPLICATION

This application is a continuation application of U.S. patent application Ser. No. 16/384,572, filed Apr. 15, 2019, issuing as U.S. Pat. No. 11,257,671, which claims the benefit of U.S. Provisional Application No. 62/738,727, filed Sep. 28, 2018, each of which are hereby incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. For example, semiconductor device fabrication may involve forming one or more layers (e.g., source/drain, active region) through an epitaxial growth process. The epitaxial growth process involves applying heat to the wafer, where the epitaxial growth occurs on exposed surfaces. Although existing methods and devices of growing epitaxial material on a wafer have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B are cross-sectional views of a semiconductor device at a stage of fabrication according to various embodiments of the present disclosure.

FIGS. 4A and 4B are cross-sectional view illustrating a desired epitaxial growth plane according to various embodiments of the present disclosure.

DETAILED DESCRIPTION

Figure 1:
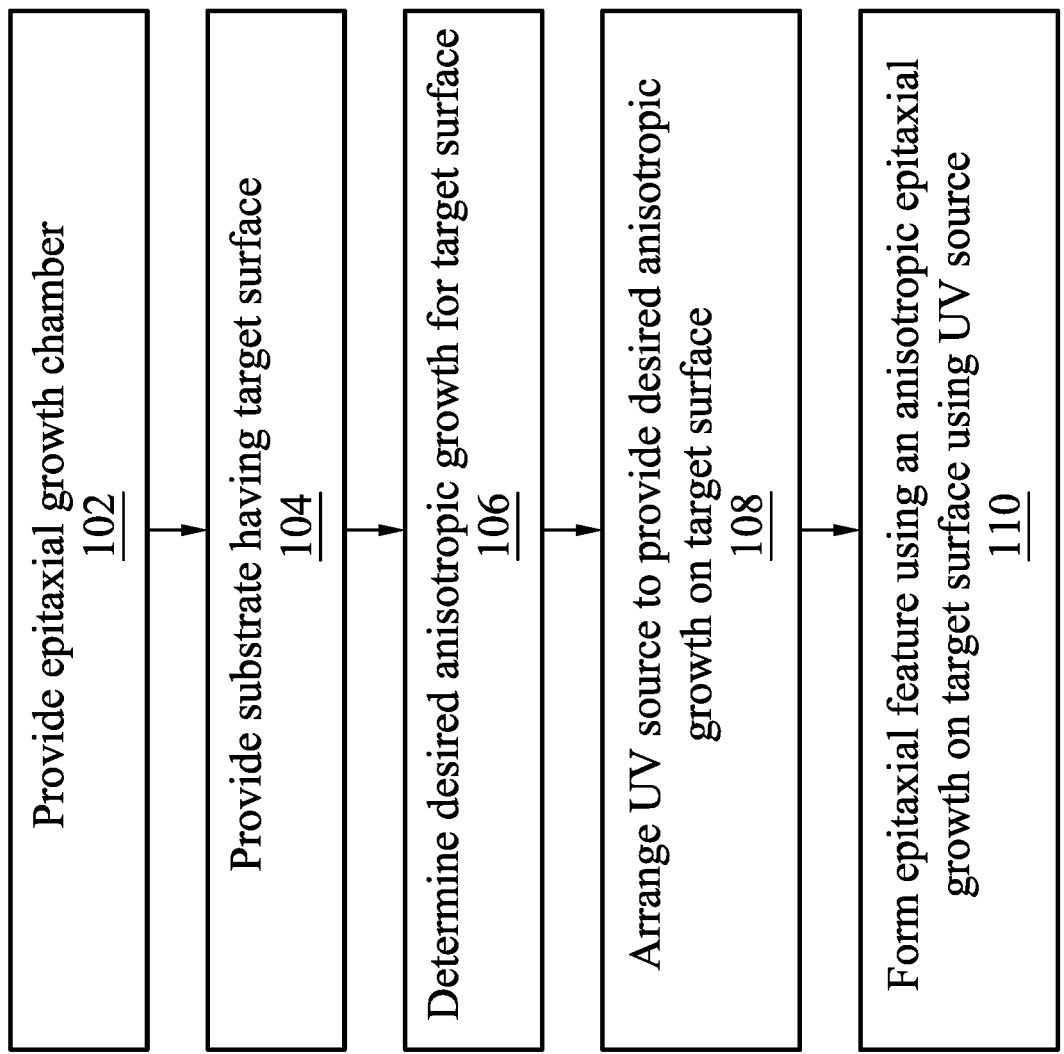
FIG. 1 is a flow chart of an embodiment of a method of performing epitaxial growth.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technologies continue to advance, traditional fabrication systems and methods may encounter various problems. For example, the fabrication of semiconductor devices may involve using an epitaxial process to form epitaxial features that provide various components of a semiconductor device, such as source/drain regions, the channel region of a transistor, other active areas, and/or other features of semiconductor devices. In these epitaxial processes, typically thermal energy (e.g., heat) is applied to or around the surface of the substrate onto which the epitaxial layer is to be grown. With the introduction of a source gas, the epitaxial growth proceeds from the exposed target surfaces. However, existing methods and systems of performing epitaxial processes have limited control over the direction (e.g., directional plane) of epitaxial growth and thus, the configuration (e.g., shape, aspect ratio, etc.) of the resulting epitaxial feature(s).

In order to achieve good semiconductor device performance or manufacturability, it may be desirable to form an epitaxial feature that is not uniformly grown (with respect to the thickness) on the target surface of the substrate. In some embodiments, epitaxial feature with a greater thickness in one direction over a second direction may be preferred. Unfortunately, existing methods and systems of performing epitaxial processes have limitations in providing anisotropic growth. For example, it may be desired to provide this anisotropic growth without reliance upon a difference in seed crystal orientation. Thus, provided herein are examples of systems and methods that provide for anisotropic epitaxial material growth through the introduction and control of energy in an ultraviolent (UV) wavelength.

Certain figures and discussion herein are directed to semiconductor devices. One example semiconductor device is a FinFET device. While the FinFET is used as an example semiconductor device to illustrate various aspects (e.g., with respect to epitaxial processes) of the present disclosure, it is understood that the present disclosure is not limited to FinFETs. A FinFET—or a fin-like field-effect transistor (FinFET) device—may be a complementary metal-oxide-semiconductor (CMOS) device including a P-type metal-oxide-semiconductor (PMOS) FinFET device and/or an N-type metal-oxide-semiconductor (NMOS) FinFET device. FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Illustrated in FIG. 1 is a flow chart of a method 100 of forming an epitaxial feature on a substrate. The method 100 may include forming an epitaxial feature for a semiconductor device. Examples of such semiconductor devices include P-channel field effect transistors (PFETs), N-channel FETs (NFETs), metal-oxide semiconductor field effect transistors (MOSFETs), complementary metal-oxide semiconductor (CMOS) transistors, high voltage transistors, high frequency transistors, bipolar junction transistors, multi-gate devices such as FinFETs or gate-all-around (GAA) devices including those with nanowires or other channel configurations, other suitable devices, and/or combinations thereof. The epitaxial feature(s) may form a region of a semiconductor device such as a source/drain region, a channel region, an active region, and/or other features of semiconductor devices. Other devices may also benefit from the methods discussed herein including, for example, light emitting diodes (LEDs), photonic devices, image sensors, microelectromechanical systems (MEMS) devices, solar cells, and/or other devices that make use of one or more epitaxial features. The epitaxial feature formed may be comprised of a semiconductor material (e.g., silicon, silicon germanium, silicon carbide) and in some embodiments, may be doped in-situ with its formation or after its formation. The doping may introduce p-type or n-type dopants depending on the desired performance.

It is understood that additional steps may be performed before, during or to complete the method 100 of fabricating the semiconductor device. For example, the semiconductor may undergo one or more deposition, patterning, doping, interconnect formation, packaging, or testing processes However, for reasons of simplicity these additional steps are not discussed herein in detail.

Figure 2B:
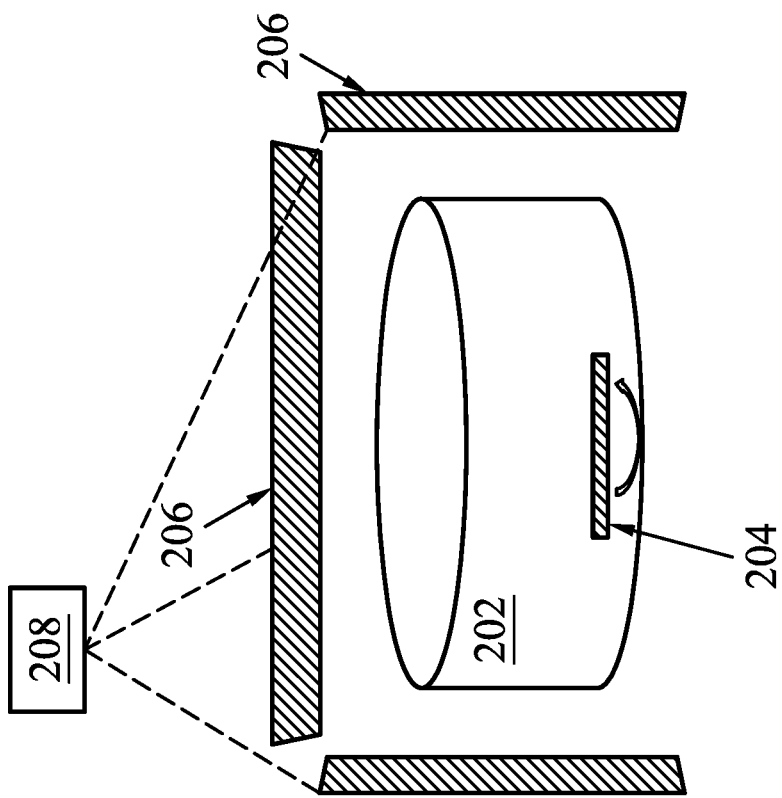
FIGS. 2A and 2B are diagrammatic view of a semiconductor fabrication apparatus according to various embodiments of the present disclosure.
Figure 2A:
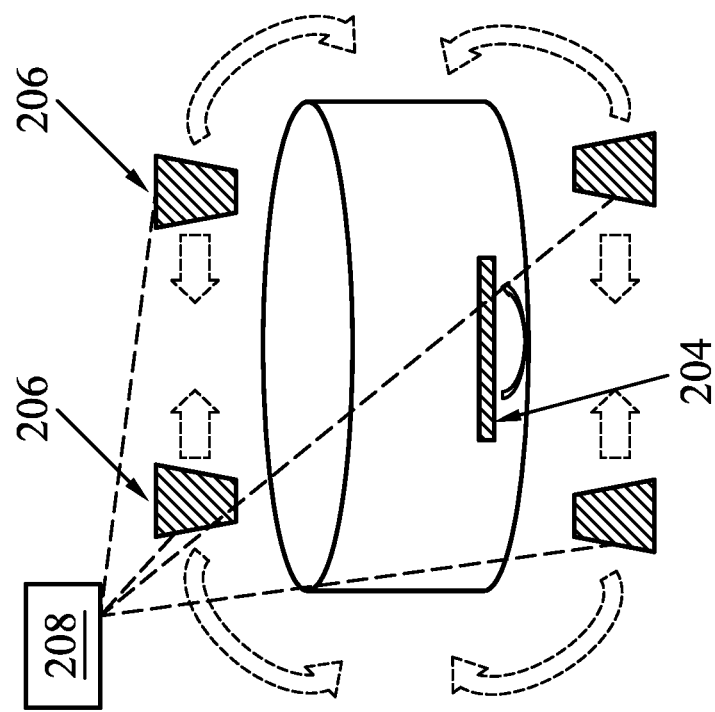

The method 100 begins at block 102 where an epitaxial growth chamber is provided. FIG. 2A,2B illustrates a simplified diagrammatic view of an exemplary fabrication apparatus 200 for performing an epitaxial process. The fabrication apparatus may be a semiconductor device fabrication apparatus such as found in a semiconductor device fabrication tool. The fabrication apparatus 200 includes a processing chamber 202, within which a target substrate can be disposed for performing epitaxial growth. The processing chamber 202 may include quartz walls, a quartz cover, an opaque chamber (including with quartz windows as discussed below with reference to FIG. 11), and/or other suitable configurations. The chamber 202 includes a wafer holder 204, which may be referred to as a susceptor. The susceptor 204 may include a wafer chuck, for example an e-chuck in some embodiments. In other embodiments, the element 204 is a "boat" configured to hold wafers such as a quartz wafer boat. Various other embodiments of substrate(s)-holding devices are possible for susceptor 204. The susceptor 204 is configured to hold or carry one or more of a substrate such as a semiconductor wafer, for example the substrate 302 (discussed below). The susceptor 204 may be operable to rotate the target substrate.

In some embodiments, the fabrication apparatus 200 includes a heating element providing thermal energy to and around the target substrate. In an embodiment, the heating element is a heating coil, for example, introducing heat from below the target substrate. In an embodiment, the heating element includes a plurality of lamps providing the thermal energy. The plurality of lamps may include IR lamps, tungsten-halogen lamps, and/or other suitable lamps. The thermal energy producing lamps may be disposed in an array and/or be single spot lamps. The heating element may provide an elevated temperature at the susceptor 204 and to a target substrate disposed on the susceptor 204. The elevated temperature may be identified and controlled by temperature reading devices (e.g., thermocouples) and control loops for temperature control. The heating device or devices may provide for heat to be introduced to the top side of the target substrate and/or the bottom side of the target substrate or susceptor 204. Various illustrations of the heating element are provided in FIGS. 5, 6, 9, and 11, discussed below.

The fabrication apparatus 200 includes UV radiation sources illustrated as UV sources 206. The UV sources may be an array of UV lamps 206, as illustrated in FIG. 2B. The UV sources may be spot UV lamps 206, as illustrated in FIG. 2A. In other embodiments, there is provided a combination of UV source configurations. UV sources 206 provide a radiation at a wavelength between approximately 100 nm and 400 nm. The UV sources 206 may be UV radiation such as produced by KrF or ArF sources, UV light emitting diodes (LEDs), and/or other suitable UV sources. In an embodiment, the UV sources (e.g., lamps) 206 are used in addition to the heating elements (e.g., lamps providing thermal energy) discussed above. In an embodiment, the UV sources (e.g., lamps) 206 are disposed in the tool in lieu of the heat source (e.g., IR lamps). In some embodiments, the UV sources 206 may each include a source (lamp) and a reflector(s).

The fabrication apparatus 200 includes UV sources 206 that are programmable by an exemplary controller 208 operably coupled to each of the UV sources 206. For example, the UV sources 206 may be moveable (e.g., as illustrated by arrows in FIG. 2A) or rotatable according to programming instructions. Each UV lamp or portion of an array UV lamps may be individually tunable. In an embodiment, the UV source 206, including portions of an array of lamps, can be programmably turned on and off during processing (e.g., epitaxial growth process) of the target substrate. The UV sources 206 may be coupled to a motor that is communicatively coupled to the controller 208 and operates according to instructions received from the controller 208. The controller 208 is a part of a semiconductor fabrication system, and it may be configured to control various processing tools such as the epitaxial growth chamber. A user may configure the controller 208 to set the processing parameters/recipes, including lamp on/off time or duration, energy provided, location of radiation provided, angle of radiation, etc.

It is noted that the UV sources 206 are illustrated in an exemplary location and quantity only and other configurations or quantities of UV lamps 206 are also possible including those introduced below.

The method 100 then proceeds to block 104 where a substrate having a target surface for epitaxial growth is provided. The substrate provided may include an elementary semiconductor (e.g., silicon or germanium) and/or a compound semiconductor (e.g., silicon germanium, silicon carbide, gallium arsenic, indium arsenide, gallium nitride, and indium phosphide). Other exemplary substrate materials include alloy semiconductors, such as silicon germanium carbide, gallium arsenic phosphide, and gallium indium phosphide. In an embodiment, the substrate is patterned to form features of semiconductor material thereby provide an exposed surface having a non-planar target surface. The substrate may include features typical of semiconductor devices including, for example, gate features, source/drain features, isolation features, doped regions, and/or other suitable features.

Referring to the examples of FIGS. 3A and 3B, illustrated are exemplary substrates 302. Each exemplary substrate 302 has a feature formed thereon, providing an exposed surface having a non-planar topography. The substrate 302 of the device of FIG. 3A includes a target surface 302A. The target surface 302A is defined by a plurality of fin elements 304 extending from the substrate 302. The target surface 302A including the fin elements 304 includes a semiconductor material. In an embodiment, the target surface 302A including the fin elements 304 is silicon. The fin elements 304 may be formed by etching fin-type features into the semiconductor substrate 302. In an embodiment, the fin elements 304 are formed by patterning the semiconductor material of or over the substrate via a lithography process, which include steps such as photoresist deposition, exposure, developing, baking, etc. (not necessarily performed in that order). A patterned photoresist formed may then be used to pattern the semiconductor layer to form the fins 304 by etching away portions of the semiconductor material not protected by the patterned photoresist. In various embodiments, portions of the fin elements 304 may serve as the source, drain, or channel regions of FinFET devices on the substrate 302.

The substrate 302 of the device of FIG. 3B includes a target surface 302B. The target surface 302B is defined by a trench 306. The target surface 302B includes a semiconductor material. In an embodiment, the target surface 302B is silicon. It is noted that FIGS. 3A and 3B are illustrative of the patterned target surface but exemplary only and other features and/or topographies of the substrate 302 or formed over the substrate 302 are also possible. It is noted that the substrate 302 may include a plurality of features typical of semiconductor devices including, for example, gate features, source/drain features, isolation features, doped regions, and/or other suitable features.

The method 100 proceeds to block 106 where a desired anisotropic growth of epitaxial material on the target surface is identified. It is recognized that there may be a desire to form an epitaxial feature on a target surface of a substrate in a non-uniform manner (e.g., having growth from one area of the surface being greater than another area of the surface). The anisotropic growth of epitaxial material produces an epitaxy feature that has a greater thickness in at least one direction from the target surface. For example, more (thicker) epitaxial material may be desired in a first direction than in a second direction. FIG. 4A is illustrative a growth plane/direction 402 and a second growth plane/direction 404 from the surface 302A of the substrate 302. In an embodiment, the direction 402 extends up from a top surface of the fin elements 304. In an embodiment, the direction 404 extends out from a sidewall surface of the fin elements 304. In some embodiments, it may be desired that a thickness of a to-be-formed epitaxial feature is greater in the direction 402 than in the direction 404. In some embodiments, alternatively, it may be desired that a thickness of a to-be-formed epitaxial layer is greater in the direction 404 than in the direction 402.

FIG. 4B is illustrative a growth plane/direction 406 and a second growth plane/direction 408 in the trench 306 of the substrate 302. In an embodiment, the direction 406 extends up from a surface of a bottom of a trench 306. In an embodiment, the direction 408 extends out from a sidewall surface of the trench 306. In some embodiments, it may be desired that a thickness of a to-be-formed epitaxial layer is greater in the direction 406 than in the direction 408. In some embodiments, alternatively, it may be desired that a thickness of a to-be-formed epitaxial feature is greater in the direction 408 than in the direction 406.

The direction desired to be thicker in epitaxial material may be selected based on the desired performance of the epitaxial feature, the ability to form an interconnection to the epitaxial feature (e.g., providing additional area for interconnection), providing for or avoiding spacing/merger of the epitaxial feature with adjacent features or portions of the epitaxial feature, design implications for device performance, fabrication process control, control of defects in the epitaxial feature growth, and/or other suitable reasons for determining a preferential plane for the epitaxial growth.

The method 100 then proceeds to block 108 where UV source(s) of the fabrication apparatus performing the epitaxial growth are arranged to provide desired anisotropic growth on target surface as identified in block 106. Based on the desired direction of preferential plane for the epitaxial growth or region of the surface for the desired increase in epitaxial growth (as discussed in block 106 above), the UV sources are arranged to provide suitable UV radiation. The UV sources are configured to provide UV radiation incident to a portion of the target surface for which the preferential growth is desired. In other words, the UV sources are arranged to provide UV radiation to the portions of the substrate where an epitaxial layer having a greater thickness is desired, where less or no UV radiation is provided to the portions of the target surface where an epitaxial layer having a lesser (or no) thickness is desired. The UV lamps may be arranged through the programmable control of the UV lamps discussed above in block 102 of the method 100. In an embodiment, the UV sources of the fabrication apparatus are programmably adjusted in their location, angle, or power based on the determined desire of block 106 of the method 100.

Figure 5:
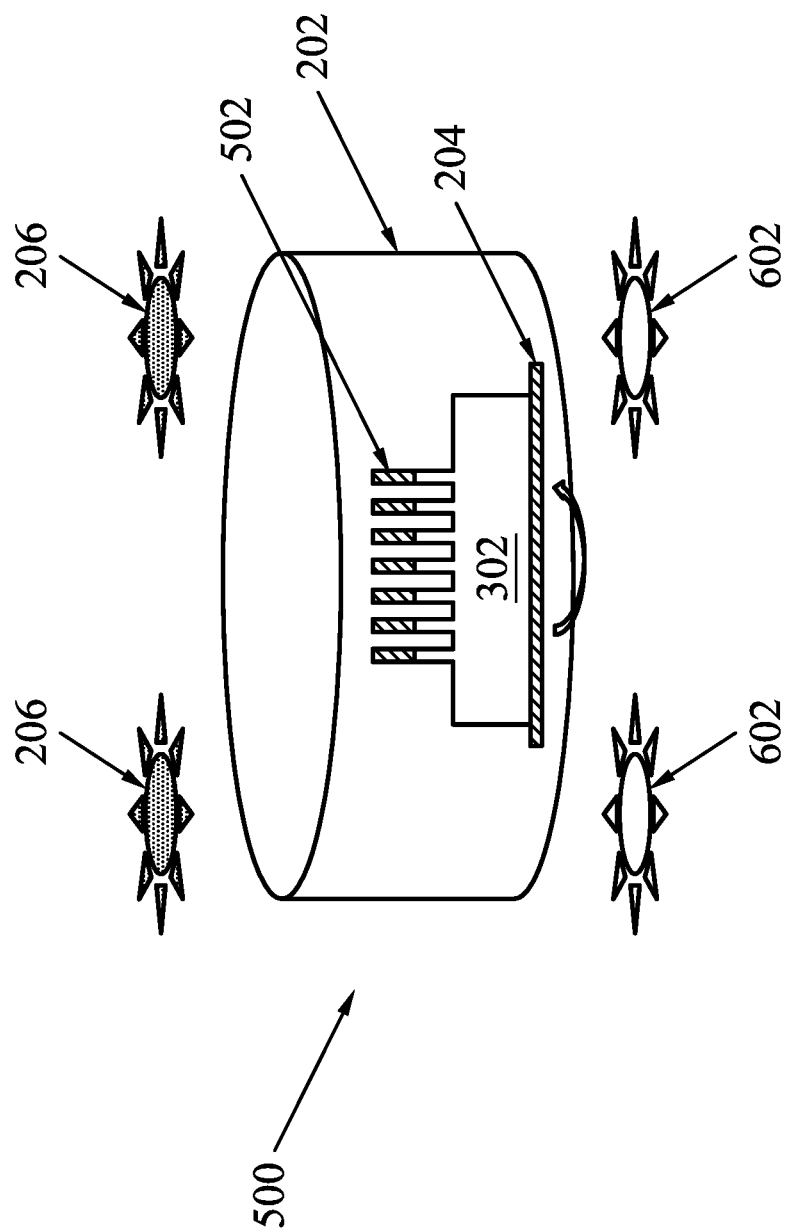
FIGS. 5, 6, 9, and 11 are diagrammatic views of exemplary semiconductor fabrication apparatuses according to various embodiments of the present disclosure.

Using the example of FIG. 5, an exemplary configuration of an epitaxial growth tool 500 is illustrated having the UV sources (e.g., lamps) 206 arranged above the susceptor 204, which holds the substrate 302 having fin elements 304. In the example of FIG. 5, thermal energy sources are not provided above the susceptor 204, but maintained below the susceptor 204. In the illustrated embodiment, the thermal energy sources are IR lamps 602, which are disposed below the susceptor 204. However, in other examples, the UV lamps 206 may be disposed as illustrated and additional heat sources (e.g., IR lamps 602) may also be located above the susceptor 204. In some embodiments, the additional heat sources such as IR lamps 602 may serve to promote the epitaxial growth (e.g., increase growth rate).

The configuration of epitaxial growth tool 500 allows for UV radiation to be introduced to a top surface of the substrate 302 and in particular to a top surface of fin elements 304 extending from the substrate 302. The configuration of epitaxial growth tool allows for UV radiation to be preferentially provided to promote growth in the direction 402 as illustrated in FIG. 4A. In the embodiment of the configuration of epitaxial growth tool 500, the chamber 202 may be made of a UV transmissive quartz material. For example, the walls of the chamber 202, in whole or in a direction in line with radiation from the UV lamps 206, are comprised of UV transmissive quartz. FIG. 5 illustrates the UV radiation is provided from the UV lamps 206 in a direction normal (perpendicular) to a surface of the substrate 302 (e.g., top surface of fins 304).

Figure 6:
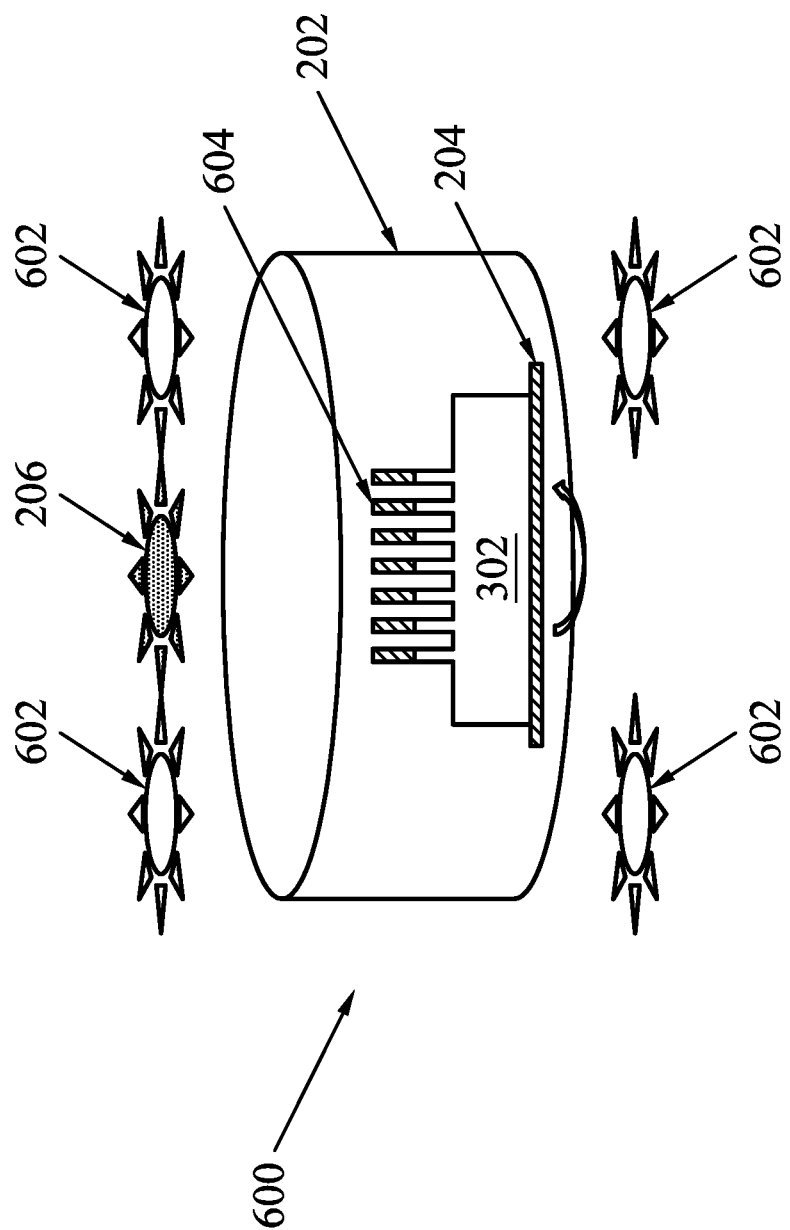

Using the example of FIG. 6, an epitaxial growth tool 600 is illustrated having the UV lamp 206 is arranged above the susceptor 204, which holds the substrate 302 having fin elements 304. In the embodiment, the epitaxial growth tool 600 includes a plurality of thermal energy sources illustrated as sources (e.g., lamps) 602. As illustrated, the lamps 602 are disposed above and below the susceptor 204. However, in other examples, the thermal energy sources may be disposed in other locations and/or omitted. In some embodiments, the additional heat sources such as IR lamps 602 may serve to promote the epitaxial growth (e.g., increase growth rate). The configuration of epitaxial growth tool 600 allows for UV radiation to be introduced to a top surface of the substrate 302 and in particular to a top surface of fin elements 304 extending from the substrate 302. The configuration of epitaxial growth tool allows for UV radiation to be preferentially provided to promote growth in the direction 402 as illustrated in FIG. 4A. In the embodiment of the configuration of epitaxial growth tool 600, the chamber 202 may be a transmissive quartz material. FIG. 6 illustrates the UV radiation is provided from the UV lamps 206 in a direction normal (perpendicular) to a surface of the substrate 302 (e.g., top surface of fins 304).

Figure 9:
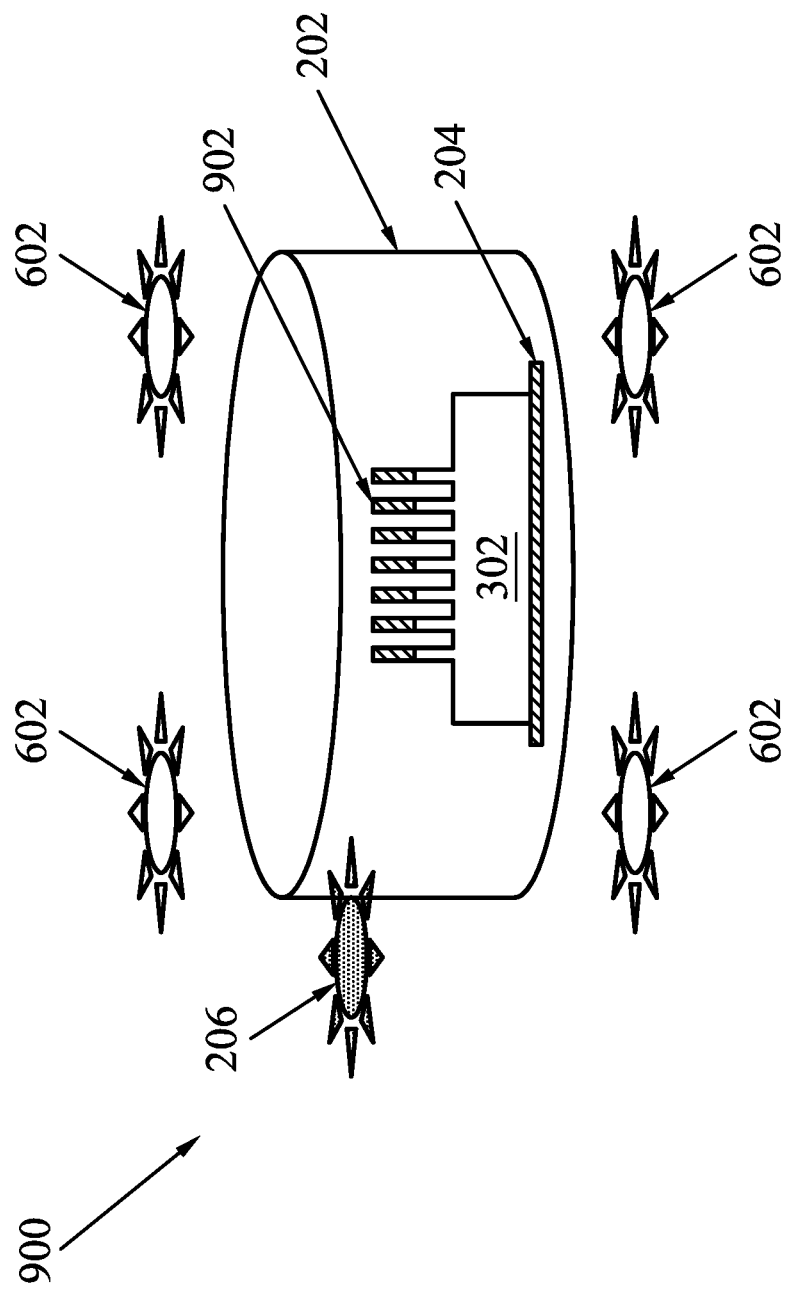

Referring now to the example of FIG. 9, a configuration of an epitaxial growth tool 900 is illustrated having a UV lamp 206 disposed at a side of the chamber 204, providing the UV radiation at an angle orthogonal to a top surface of a substrate 302 disposed on the susceptor 204. As illustrated in the configuration of the epitaxial growth tool 900, a plurality of thermal energy sources 602 are disposed in the epitaxial growth tool 900. In an embodiment, the thermal energy sources 602 are IR lamps. As illustrated the heat source (e.g., IR lamps) 602 are disposed above and below the susceptor 204. However, other embodiments are possible including those with more or less lamps (including those configurations illustrated in FIGS. 5 and 6, discussed above). In some embodiments, the configuration and number of thermal energy sources such as IR lamps may serve to promote the epitaxial growth (e.g., increase growth rate). The configuration of epitaxial growth tool 900 allows for UV radiation to be introduced to a side surface of the target surface of the substrate 302 and in particular to a sidewall surface of fin elements 304 extending from the substrate 302. The configuration of epitaxial growth tool allows for UV radiation to be preferentially provided to promote growth in the direction 404 as illustrated in FIG. 4A. It is noted that the susceptor 204 may allow for rotation of the substrate 302 such that the UV radiation from the UV source 206 is incident each side of the fins 304 of the substrate 302 as the susceptor 204 rotates. In the embodiment of the configuration of epitaxial growth tool 900, the chamber 202 may be a transmissive quartz material.

In an embodiment, one or more additional UV source 206 are provided on an additional side of the susceptor 204 also providing radiation an angle orthogonal to a top surface of a substrate disposed on the susceptor 204.

As discussed above, the method 100 at block 108 includes providing the substrate in the epitaxial growth chamber having the UV source configuration being selected (e.g., before, after or during the loading of the substrate into the chamber). The substrate may be substantially similar to as discussed above with reference to block 104 and/or FIGS. 3A and 3B. The substrate may be disposed on the susceptor 204 with a target surface of the substrate exposed. Referring to the examples of FIGS. 5, 6, and 9, a substrate 302 is illustrated as disposed on the susceptor 204. The tools 500, 600 and 900 may be substantially similar to the apparatus 200 discussed above with reference to FIG. 2A/2B.

After configuring the chamber for the desired epitaxial growth, the method 100 then proceeds to block 110 where epitaxial growth is performed on the target surface of the substrate. In an embodiment, the epitaxial growth process is performed while the UV radiation is introduced from the UV sources configured in block 108. Due to the configuration of the UV source(s) and the UV radiation provided therefrom, an anisotropic epitaxial growth may be achieved during the epitaxial growth process. Thus, an epitaxial feature having a thickness in a first direction greater than a second direction can be formed. The anisotropic epitaxial growth can result from the exposure of portions of a target surface to UV radiation from the UV source before and/or during the epitaxial growth process. Specifically, the UV radiation is incident a target surface at a given region, and that given region has a higher (i.e., quicker) epitaxial growth rate that portions of the target surface that are not subjected to the UV radiation.

In an embodiment, the UV radiation may add an extra boost of energy that can promote epitaxial growth generally. In addition, and noting that the present disclosure is not being bound by any one theory, in an embodiment, the UV radiation interacts with and removes species that may be passivating the target surface of the substrate and/or exposed surface of epitaxial feature formed during the growth process. In some embodiments, the passivating species (or atoms) may originate from a source or precursor gas used during the epitaxial growth process. The source gas may include the epitaxial material (e.g., semiconductor atom(s) such as silicon to be bonded to the substrate to form the epitaxial feature) and additional byproducts provided with the desired epitaxial material. The additional byproduct may include atoms that do not react to form the epitaxial feature. For example, typical precursors or source gases for the epitaxial growth process to form an epitaxial feature including silicon (Si) include the $SiH_4$, $SiCl_2H_2$, $Si_2H_6$, and/or other suitable source compounds. For example, typical precursors or source gases for the epitaxial growth process to form an epitaxial feature including germanium (Ge) include the $GeH_4$ and/or other suitable source compounds. In these exemplary source compounds, chlorine (Cl) and/or hydrogen (H) are byproducts. The byproducts such as hydrogen and chlorine may adhere to the target surface, which may be referred to herein as passivating the surface. The byproducts can inhibit the epitaxial growth of the epitaxy feature from the passivated surface.

To address this passivating of the surface, in some embodiments, the method 100 includes providing UV radiation incident the surface. The UV radiation can remove the byproducts (e.g., Cl, H) from the target surface (e.g., Si) or from portions of the target surface. The removal of the byproducts can generate dangling bonds, which serve as nucleation sites for the epitaxial growth. For example, the UV radiation can reduce chlorine (free of combined chlorine compounds (chloramines)) into easily removed byproducts leaving dangling bonds where the chlorine was attached to the surface. At UV wavelengths, the radiation may produce photochemical reactions that dissociate chlorine to form hydrochloric acid. After UV exposure, the byproducts can then be removed from the surface and subsequently the chamber. It is noted that while chlorine and hydrogen are used as exemplary byproduct atoms, other atoms that are included in a source gas but are not the intended composition of the epitaxy to be grown may also be possible.

Thus, the source gas byproducts (Cl, H) are removed from a portion of the target surface by UV treatment providing dangling bonds at the treated surface. The treated surface—specifically the portion of the target surface having the incident UV radiation (e.g., removing hydrogen, chlorine or other deposited atoms)—provides for a greater epitaxial growth rate than those portions of the exposed surface not treated with UV radiation (or treated with less UV energy). This is because the dangling bonds left from the departure of the byproducts are readily available nucleation sites for the epitaxial growth. Thus, during the epitaxial growth process anisotropic growth results from the differences in the treated and non-treated surfaces. It is also noted that the target surface for epitaxial growth includes the original surface upon which the epitaxial material is grown (e.g., substrate 302), in addition to the (interim) exposed surface of the epitaxial feature during its formation.

In an embodiment, it is determined in block 106 of the method 100 that epitaxial growth dominating from a top surface of a fin structure extending from the substrate is desired. Referring to the example of FIG. 5, an epitaxial feature 502 is grown over the substrate 302 by anisotropic epitaxial growth such that the epitaxy feature 502 is predominately extending from an upper surface of the fins 304. Using the example of the configuration of the epitaxial growth tool 500, the upper surface of the fins 304 are exposed to the UV radiation due to the configuration of the UV sources 206 providing the UV radiation predominately directed to the top surface of the fins 304. Thus, of the target surface, a first portion—the top surface of the fins 304—is treated with UV radiation while a second portion—the sidewalls of the fins 304—is not treated (e.g., no or less UV radiation is provided). Thus, the epitaxial feature 502 is formed at a greater rate from the top surface of the fin elements 304 as it has been treated with UV radiation removing the passivating atoms. Conversely, epitaxial growth on the sidewalls of the fin elements 304 is substantially less than that of the top surface as the sidewalls were not exposed to the level of UV radiation of the top surface of the fin elements 304. The non-treated portions of the substrate 302, for example, sidewalls of the fin elements 304 may remain passivated by the byproducts, which inhibit nucleation from the sidewalls. In an embodiment, a growth ratio of the top surface to side surfaces can be denoted X: 1, where X>1. In an embodiment, X>5. In an embodiment, X>20. In an embodiment, there is substantially no growth on the sidewalls, while there is growth on the top surface (as illustrated in FIG. 5).

In an embodiment, it is determined in block 106 that epitaxial growth dominating from a top surface of a fin element extending from the substrate is desired. Referring to the example of FIG. 6, an epitaxial feature 604 is grown over the substrate 302 by anisotropic epitaxial growth such that the epitaxy feature 604 is predominately extending from an upper surface of the fin elements 304. Using the example of the configuration of the epitaxial tool 600, the upper surface of the fins 304 are exposed to the UV radiation due to the configuration of the UV sources 206 providing the UV radiation predominately directed to the top surface of the fins 304. Thus, the epitaxial feature 604 is growth at a greater rate from the top surface of the fins 304 as it is treated with UV radiation removing the passivated atoms. Conversely, epitaxial growth on the sidewalls of the fin elements 304 is substantially less than that of the top surface as the sidewalls were not exposed to the level of UV radiation of the top surface of the fin elements 304. The non-treated portions of the substrate 302, for example, sidewalls of the fin elements 304 may remain passivated by the byproducts, which inhibit nucleation from the sidewalls. In an embodiment, a growth ratio of the top surface to side surfaces can be denoted X: 1, where X>1. In an embodiment, X>5. In an embodiment, X>20. In an embodiment, there is substantially no growth on the sidewalls, while there is growth on the top surface (as illustrated in FIG. 6).

In an embodiment, it is determined in block 106 that epitaxial growth dominating from a sidewall surface of a fin element extending from the substrate is desired. Referring to the example of FIG. 9, an epitaxial feature 902 is grown over the substrate 302 anisotropically such that the epitaxy feature 902 is formed predominately extending from sidewall surfaces of the fin elements 304 of the substrate 302. Using the example of the configuration of the epitaxial growth tool 900, the sidewall surfaces of the fins 304 are exposed to the UV radiation due to the configuration of the UV sources 206 providing the UV radiation predominately directed to the sidewall surfaces of the fins 304. (It is noted that the rotation of the substrate 304 may serve to expose all sidewall surfaces of the fins 304.) Thus, the epitaxial feature 902 is growth anisotropically by growing a greater rate from the sidewall surface of the fin elements 304 than a top surface of the fin elements 304. Thus, epitaxial growth on the top surface of the fin structure is substantially less than that of the sidewall surface. The non-treated portions of the substrate 302, for example, top of the fin elements 304 may remain passivated by the byproducts, which inhibit nucleation from the top surface. In an embodiment, a growth ratio of the sidewall surface to top surfaces can be denoted Y: 1, where Y>1. In an embodiment, Y>5. In an embodiment, Y>20. In an embodiment, there is substantially no growth on the top surface, while there is growth on the sidewall surfaces (as illustrated in FIG. 9).

Figure 7:
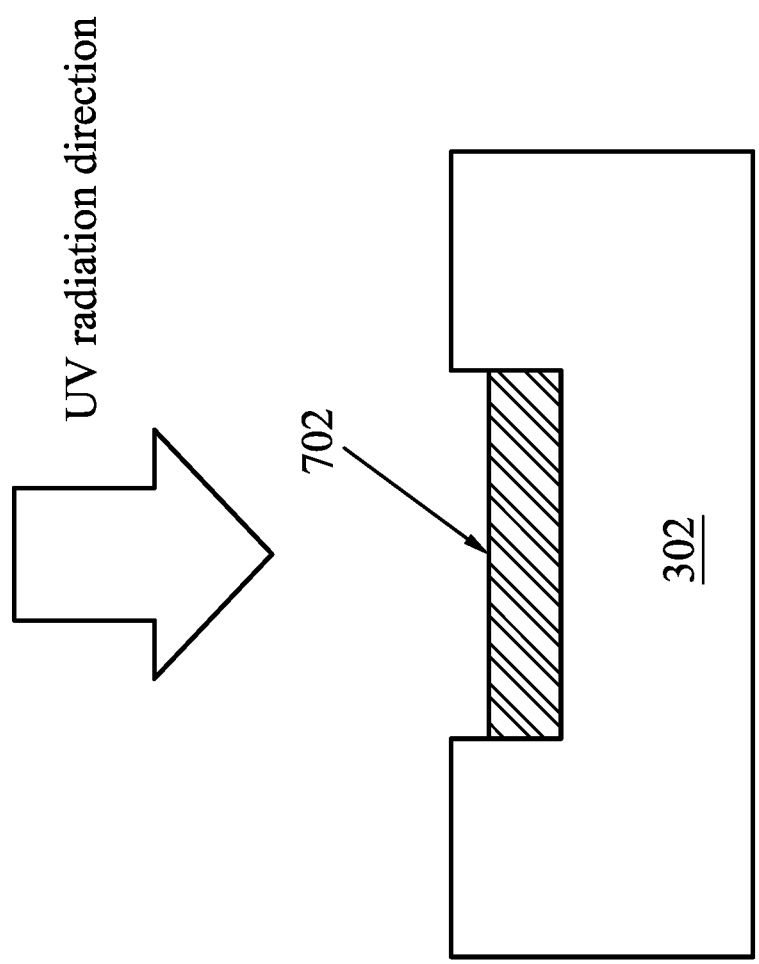
FIGS. 7, 8, and 10 are cross-sectional views illustrating exemplary epitaxial features grown according to various embodiments of the present disclosure.
Figure 8:
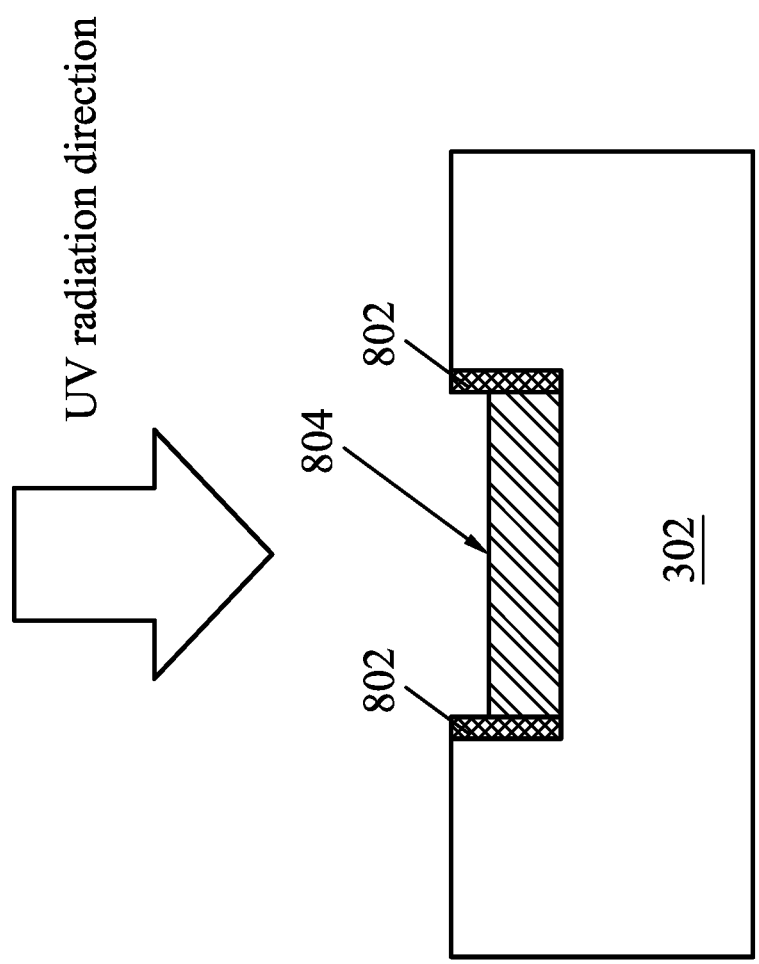

FIGS. 7 and 8 provide additional embodiments of the substrate 302 that may benefit from the method 100. Illustrated in FIG. 7, the substrate 302 has an epitaxial feature 702 grown from the bottom of a trench 306 such as illustrated in FIG. 4B. To produce such a feature, in block 106 of the method 100 it is desired epitaxial growth direction 406 is preferred. The configuration of UV sources is then provided to expose the bottom surface of the trench to UV radiation as opposed to the sidewall surfaces of the trenches. The provision of the UV radiation at a direction normal to the surface of the substrate 302 may provide for epitaxial growth from the bottom surface of the trench. This may be because the byproducts passivating the bottom surface of the trench are removed by the UV radiation. In contrast, the nucleation of the epitaxial growth in direction 408 (the sidewalls of the trench) is relatively reduced due to the existence of the byproducts continuing to passivate the sidewalls of the trench. The reduction of nucleation at the sidewalls can reduce the defects formed in the epitaxial feature 702. FIGS. 5 and 6 are exemplary configurations of epitaxial tools that may provide for such anisotropic growth shown in FIG. 7.

FIG. 8 is illustrative of a substrate 302 substantially similar to that of FIGS. 4 and 7, except that a sidewall of the trench feature is defined by dielectric material 802. Without applying means for controlling the growth, epitaxial growth in a trench with a dielectric material sidewall can result in faceted epitaxial growth as the dielectric material does not provide a nucleation site. However, in FIG. 8, illustrated is an epitaxial feature 804 that lacks facets. The epitaxial feature 804 results from exposing the bottom surface of the trench to UV radiation. The irradiation of the UV normal to the surface of the substrate 302 may provide for epitaxial growth from the bottom surface of the trench. FIGS. 5 and 6 are exemplary configurations of epitaxial tools that may provide for such anisotropic growth. It is understood that facets are formed during epitaxial growth process because growth in the facet direction (e.g., (111) direction) is slower. The UV radiation process discussed herein can be applied to the trench structure such as illustrated in FIG. 8 to increase the growth rate in the facet-forming direction (e.g., (111)) such that the growth rate in that direction (the facet-forming direction) is at a substantially equivalent rate as the other direction (e.g., upward). If growth rate in different directions is substantially equal, the formed epitaxial feature, such as epitaxial feature 804, would lack facets. In this manner the UV radiation process can be controlled to achieve this substantially equal growth rate.

During any or all of the embodiments discussed herein, it is noted that in some embodiments, the UV irradiation may be concurrent and continuous with the epitaxial growth process. For example, during the introduction of the source gas, the UV radiation maybe continually applied. Specifically, as the respective epitaxial feature is grown, atoms from the source gas may be continually deposited on the exposed surface of the epitaxial feature. Thus, continued UV irradiation of a given surface continues to remove the byproduct atoms that may passivate the surface thereby promoting epitaxial growth from that portion of the surface.

In some embodiments, the configuration of the UV irradiation may be varied during the epitaxial growth process. In an embodiment, the UV intensity may be varied before and/or during the epitaxial growth process. In an embodiment, the UV radiation "on" and "off" state may be varied before and/or during the epitaxial growth process. This is because during an epitaxial growth process, the UV irradiation may be programmably controlled to result in different extents of anisotropic nature of the growth. For example, after a time t, the UV source may be shut off, and the epitaxial growth may continue in an isotropic manner. Thus, the variation on on/off time and/or the variation of intensity can be used to change and control the shape of the result epitaxial feature. In an exemplary embodiment, it is desired to form an epitaxial feature such as epitaxial features 502, 604, 702, 804, 902, and/or 1002 having a first composition for a first region of the epitaxial feature and a second composition from a second region of the epitaxial feature. For example, in an embodiment, the first region may be a silicon epitaxial portion and the second region may be a silicon germanium epitaxial portion together forming epitaxial features 502, 604, 702, 804, 902, and/or 1002. In a further embodiment, the UV radiation may be turned on for the epitaxial growth of the first region (e.g., silicon) and turned off for the epitaxial growth of the second region (e.g., silicon germanium).

In an embodiment, the UV irradiation may be performed prior to the epitaxial growth as a pre-treatment in addition to or in lieu of providing the UV irradiation during the growth process. The UV irradiation as a pre-treatment may prepare the surface by absorbing any undesired species such as byproducts or contaminates from other sources (e.g., chamber walls). The UV irradiation as a pre-treatment, like the UV irradiation during the epitaxial growth provides a surface with dangling bonds as a nucleation site for epitaxial growth.

Figure 10:
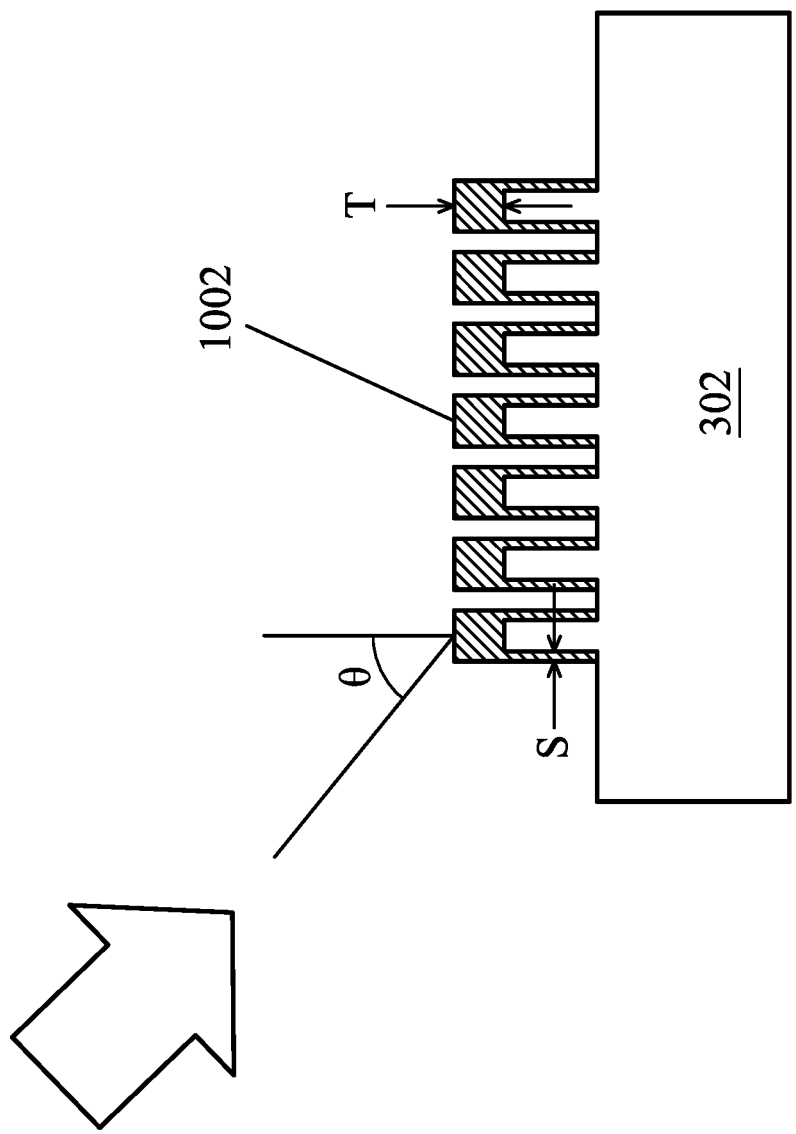

Another variable operable to control the shape of the resultant epitaxial feature is the angle of incident UV irradiation. This angle of incident UV radiation may be determined and kept constant throughout the epitaxial growth process, or may be varied during the epitaxial growth process. FIG. 10 is illustrative of an angle θ of the incident UV radiation to the substrate 302. The angle θ may define a degree from normal that the UV radiation is introduced to the substrate 302. The angle θ may be determinative of the amount of epitaxial material grown on sidewalls of the fin elements 304 and/or the top of the fin elements 304. As illustrated in FIG. 10, increasing the angle θ from normal provides for additional exposure to UV radiation onto sidewall of the fin elements 304, which increases the amount of epitaxial material grown on the sidewalls and may decrease the exposure of the top surface of the fin elements thus, decreasing the epitaxial material on the top of the fins. Conversely, decreasing the angle θ increases the exposure to UV radiation of the top surface of the fin elements 304, while decreasing exposure to UV radiation on the sidewalls of the fin elements 304. This decrease in the angle θ allows for greater growth from the top surface than the sidewall of epitaxial material.

Thus, FIG. 10 is illustrative of variation of the angle θ to control the relative growth of the epitaxial feature 1002. Thus, top-to-side growth ratio (T to S) can be controlled by changing the angle θ of UV irradiation relative to the top of the fin structures 304. For example, decreasing the angle θ increases the relative growth of the epitaxial feature 1002 on a top surface of the fin 304 while decreasing the relative thickness of the epitaxial feature 1002 generated on the sidewalls of the fin 304. FIG. 10 may be implemented using a UV source configuration such as described above with reference to FIG. 9.

In some embodiments, the epitaxial features formed by the method 100, such as exemplified by epitaxial features 502, 604, 702, 804, 902, and/or 1002 are source/drain epi-layers formed on the substrate 302. In an embodiment, the epitaxial features are formed on and around the fins 304 as illustrated. In some embodiments, the epitaxial features such as exemplified by epitaxial features 502, 604, 702, 804, 902, and/or 1002 are silicon (Si). In some embodiments, the epitaxial features grown are germanium (SiGe). In other embodiments, the epitaxial features grown are silicon carbide (SiC), or some other suitable material. The epitaxial features may be formed be doped (in-situ with the growth or after) by suitable dopants such as n-type and p-type dopants.

Figure 11:
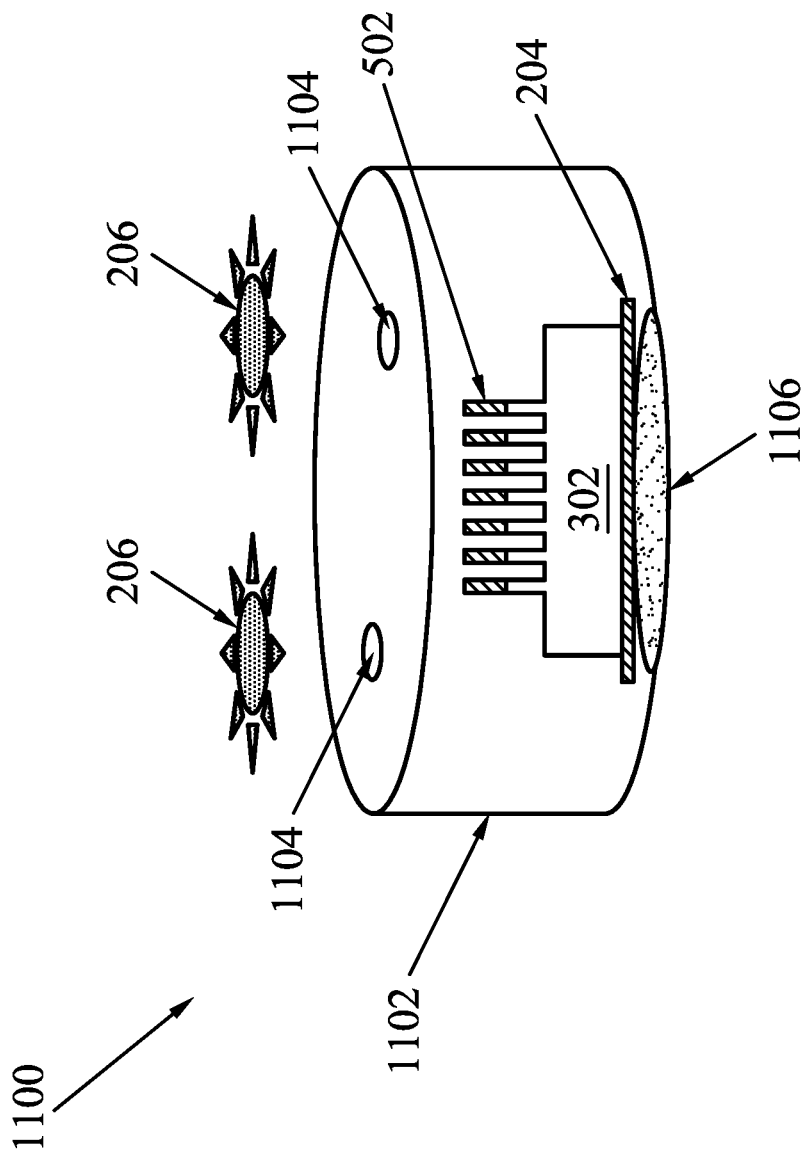

Referring now to FIG. 11, illustrated is an alternative embodiment of an epitaxial growth tool 1100 including chamber 1102. The epitaxial growth tool 1100 may be substantially similar to the epitaxial growth tool 200 and the chamber 202 and/or the chambers of FIGS. 5, 6, and 9. However, one difference illustrated is that chamber 1102 differs in material. In an embodiment, the chamber 1102 is opaque material. In an embodiment, the chamber 1102 is steel. Other suitable materials are also possible and within the scope of the chamber 1102. In order to introduce the UV radiation to the substrate 302, such as discussed herein, the chamber 1102 is configured with windows 1104. The windows 1104 may be configured in line with the radiation from UV sources 206. The windows 1104 may be composed of transparent material. In an embodiment, the windows 1104 are quartz. A heating coil 1106 may be disposed in the chamber 1102 providing a thermal energy source for the epitaxial growth process. In an embodiment, the heating coil 1106 is used in lieu of IR lamps 602 as a heat source for the epitaxial process.

The present disclosure may offer advantages over conventional semiconductor devices and the fabrication thereof. It is understood, however, that other embodiments may offer additional advantages, and not all advantages are necessarily disclosed herein, and that no particular advantage is required for all embodiments. One advantage is that the individually-tunable UV radiation allows for anisotropic epitaxial growth. This allows for the formation of an epitaxial feature having a greater thickness in a first direction than a second direction by controlling the UV radiation during the epitaxial growth process.

One aspect of the present disclosure involves a semiconductor fabrication apparatus including a susceptor, a UV radiation producing source and a heat source. The susceptor is configured to hold a substrate in a chamber. The UV radiation producing source is disposed over the susceptor. The UV radiation producing source is tunable to provide UV radiation to a portion of a surface of the substrate held in the susceptor. The heat source provides heat energy to the chamber.

In a further embodiment, the UV radiation producing source is a plurality of UV radiation producing lamps each individually-tunable to provide UV radiation to the portion of the surface of the substrate held in the susceptor. In an embodiment, the UV radiation producing source is disposed at an angle above the susceptor orthogonal to a surface of the substrate. In a further embodiment, this angle is tunable. In an embodiment, the radiation producing source is disposed to provide UV radiation normal a surface of the substrate on the susceptor. In an embodiment of the semiconductor fabrication apparatus, the chamber is opaque with a transparent window. In an embodiment, the radiation producing source is disposed such that UV radiation enters the chamber through the transparent window.

In another of the broader embodiments discussed herein, a method of semiconductor fabrication includes positioning a substrate on a susceptor in a chamber and growing an epitaxial feature on the substrate. The growing includes providing UV radiation to a first region of a surface of the substrate and while providing the UV radiation, growing a first portion of the epitaxial feature on the first region of the surface while concurrently growing a second portion of the epitaxial feature on a second region of the surface of the substrate. The first portion of the epitaxial feature can be greater in thickness than the second portion of the epitaxial feature.

In some embodiments of the method, the first region of the surface is a top surface of a fin element. In a further embodiment, the second region of the surface is a sidewall surface of the fin element. In an embodiment, the first region of the surface is a bottom surface of a trench; the second region of the surface can be a sidewall of the trench. In an embodiment, the method also includes rotating the susceptor while providing the UV radiation. In an embodiment, the method also includes turning off the UV radiation during a second stage of the growing the epitaxial feature. In an embodiment, the method includes introducing a source gas including silicon and a byproduct, growing the first portion of the epitaxial feature using the silicon and removing the byproduct from the first region of the surface of the substrate using the UV radiation.

In another of the broader embodiments, a method of fabricating a semiconductor device includes placing a substrate on a susceptor that is disposed in a chamber. An epitaxial growth process on the substrate is performed that includes introducing a source gas including a semiconductor and a byproduct; generating thermal energy using a heat source; growing an epitaxial feature on a surface of the substrate using the semiconductor; and during the growing the epitaxial feature, exposing at least a portion of the surface to a UV radiation.

In a further embodiment, exposing the at least the portion of the surface removes the byproduct from the exposed portion of the surface. In an embodiment of the method, growing the epitaxial feature includes an anisotropic growth. In an embodiment, the exposing the at least the portion of the surface to UV radiation includes providing the UV radiation at a direction normal to the surface of the substrate. In an embodiment, the exposing at least the portion of the surface to the UV radiation includes providing the UV radiation at a direction having orthogonal to a direction normal to the surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor fabrication, comprising:
   providing a semiconductor fabrication apparatus, the semiconductor fabrication apparatus including:
   a susceptor configured to hold a substrate in a chamber;
   a UV radiation producing source disposed over the susceptor, wherein the UV radiation producing source includes a plurality of UV radiation lamps operable to provide a tunable amount of UV radiation; and
   a heat source providing heat energy to the chamber;
   positioning the substrate on the susceptor, wherein the substrate has a first region and a second region; and
   tuning the plurality of UV radiation lamps to provide a first amount of UV radiation to the first region of the substrate while concurrently providing a second amount of UV radiation to the second region of the substrate during an epitaxial growth process on the first region and the second region, wherein the first amount of UV radiation is different than the second amount of UV radiation wherein the first region is on a first plane and the second region is on a second plane, the second plane substantially perpendicular to the first plane.

2. The method of semiconductor fabrication of claim 1, further comprising:
   providing thermal energy to the substrate in the chamber, wherein the thermal energy is provided from below the susceptor.

3. The method of semiconductor fabrication of claim 2, wherein the thermal energy is provided from a heating coil disposed below the susceptor.

4. The method of semiconductor fabrication of claim 2, wherein the thermal energy is provided from a plurality of thermal energy producing lamps disposed below the susceptor.

5. The method of semiconductor fabrication of claim 4, wherein the thermal energy is provided from another plurality of thermal energy producing lamps disposed above the susceptor.

6. The method of semiconductor fabrication of claim 1, wherein the tuning the plurality of UV radiation lamps includes turning at least a first lamp of the plurality of UV radiation lamps off.

7. The method of semiconductor fabrication of claim 6, wherein the tuning the plurality of UV radiation lamps includes having a second lamp of the plurality of UV radiation lamps on while the first lamp is off.

8. The method of semiconductor fabrication of claim 1, wherein the tuning the plurality of UV radiation lamps includes rotating an angle of at least one lamp of the plurality of UV radiation lamps.

9. The method of semiconductor fabrication of claim 1, wherein the plurality of UV radiation lamps is disposed at a side of the chamber providing UV radiation at an angle with respect to a top surface of the substrate.

10. A method of semiconductor fabrication including:
positioning a substrate on a susceptor in a chamber;
positioning a plurality of UV radiation lamps above the susceptor, wherein the plurality of UV radiation lamps provide radiation to the substrate on the susceptor;
coupling the plurality of UV radiation lamps to a motor that is communicatively coupled to a controller;
sending instructions to the controller to vary at least one UV radiation lamp of the plurality of UV radiation lamps;
providing radiation from the plurality of UV radiation lamps according to the instructions, wherein the providing the radiation provides different UV amounts to a first region of the substrate than a second region of the substrate; and
during the providing the radiation of the different UV amounts, concurrently growing a first portion of an epitaxial feature on the first region of the substrate at a first rate and a second portion of the epitaxial feature on the second region of the substrate at a second rate, wherein the first rate and the second rate are determined by the instructions, wherein the first portion of the epitaxial feature is grown on the first region disposed at a first plane and the second portion of the epitaxial feature is grown on the second region disposed at a second plane, the second plane perpendicular to the first plane.

11. The method of claim 10, wherein the sending the instructions includes using the motor to move the at least one UV radiation lamp during the concurrently growing.

12. The method of claim 10, wherein the at least one UV radiation lamp of the plurality of UV radiation lamps is moved from adjacent above the chamber to adjacent a side of the chamber.

13. The method of claim 10, wherein the sending the instructions includes turning off the at least one of the UV radiation lamps during the growing.

14. The method of claim 13, wherein the at least one of the plurality of UV radiation lamps is disposed in an array of UV radiation lamps.

15. The method of claim 10, wherein the sending the instructions includes changing angle of radiation delivered to the substrate from the at least one of the plurality of UV radiation lamps.

16. A method of fabricating a semiconductor device, comprising:
placing a substrate on a susceptor that is disposed in a chamber, wherein the substrate has a semiconductor surface exposed;
providing a plurality of UV radiation lamps operable to direct UV radiation to the substrate:
performing an epitaxial growth process to form an epitaxial feature on the semiconductor surface of the substrate, wherein UV radiation is introduced to the semiconductor surface from the plurality of UV radiation lamps in a first configuration during a first portion of the epitaxial growth process and UV radiation is introduced to the semiconductor surface from the plurality of UV radiation lamps in a second configuration during a second portion of the epitaxial growth process, wherein the first and second configurations provide for anisotropic growth of the epitaxial feature; and wherein the first configuration provides UV radiation at a direction normal to the semiconductor surface of the substrate, and the first portion of the epitaxial growth is from a horizontal plane; and wherein the second configuration provides UV radiation at an angle less than 90 degrees from the semiconductor surface of the substrate, and the second portion of the epitaxial growth is from a vertical plane.

17. The method of claim 10, wherein instructions determine the first rate and the second rate by implementing differing an angle of at least one of the plurality of UV radiation lamps.

18. The method of claim 10, wherein the instructions determine the first rate and the second rate by implementing differ by an on/off state of at least one of the plurality of UV radiation lamps.

19. The method of claim 10, wherein the instructions provide UV radiation at the first plane disposed at a direction normal to the semiconductor surface of the substrate.

20. The method of claim 19, wherein the instructions provide UV radiation at an angle less than 90 degrees.

* * * * *